(12) United States Patent
Wertz

(10) Patent No.: US 8,437,138 B2
(45) Date of Patent: May 7, 2013

(54) LOWER PROFILE HEAT DISSIPATING SYSTEM EMBEDDED WITH SPRINGS

(75) Inventor: Darrell Lynn Wertz, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 212 days.

(21) Appl. No.: 13/035,894

(22) Filed: Feb. 25, 2011

(65) Prior Publication Data

US 2012/0218718 A1    Aug. 30, 2012

(51) Int. Cl.
   *H05K 7/20*    (2006.01)
(52) U.S. Cl.
   USPC ............................................. 361/720
(58) Field of Classification Search ............. None
   See application file for complete search history.

(56) References Cited

U.S. PATENT DOCUMENTS

| | | | | |
|---|---|---|---|---|
| 5,171,290 A * | 12/1992 | Olla et al. | | 439/71 |
| 5,221,209 A * | 6/1993 | D'Amico | | 439/71 |
| 5,917,701 A * | 6/1999 | Solberg | | 361/704 |
| 5,930,114 A * | 7/1999 | Kuzmin et al. | | 361/704 |
| 6,191,480 B1 * | 2/2001 | Kastberg et al. | | 257/727 |
| 6,504,720 B2 * | 1/2003 | Furuya | | 361/699 |
| 6,570,761 B2 * | 5/2003 | Stone et al. | | 361/679.47 |
| 6,707,676 B1 * | 3/2004 | Geva et al. | | 361/719 |
| 6,708,754 B2 * | 3/2004 | Wei | | 165/46 |
| 6,816,375 B2 * | 11/2004 | Kalyandurg | | 361/704 |
| 6,865,082 B2 * | 3/2005 | Huang et al. | | 361/700 |
| 6,883,594 B2 * | 4/2005 | Sarraf et al. | | 165/104.33 |
| 6,961,243 B2 * | 11/2005 | Shih-Tsung | | 361/700 |
| 7,008,239 B1 * | 3/2006 | Ju | | 439/71 |
| 7,086,125 B2 * | 8/2006 | Slobodecki et al. | | 24/295 |
| 7,257,004 B2 * | 8/2007 | Costello | | 361/719 |
| 7,463,496 B2 * | 12/2008 | Robinson et al. | | 361/818 |
| 7,589,972 B2 * | 9/2009 | Ma et al. | | 361/719 |
| 7,619,895 B1 * | 11/2009 | Wertz et al. | | 361/719 |
| 7,628,651 B2 * | 12/2009 | Yeh | | 439/607.37 |
| 7,641,505 B2 * | 1/2010 | Ma | | 439/485 |
| 7,684,198 B2 * | 3/2010 | Fang | | 361/719 |
| 7,883,357 B2 * | 2/2011 | Lin et al. | | 439/487 |
| 2001/0010624 A1 * | 8/2001 | Katsui | | 361/709 |
| 2004/0052054 A1 * | 3/2004 | Huang et al. | | 361/719 |
| 2005/0265000 A1 * | 12/2005 | He | | 361/709 |
| 2008/0291638 A1 * | 11/2008 | Ma et al. | | 361/719 |
| 2009/0021918 A1 * | 1/2009 | Fang | | 361/720 |
| 2009/0080158 A1 * | 3/2009 | Conn | | 361/699 |
| 2009/0154102 A1 * | 6/2009 | Zhou et al. | | 361/700 |

\* cited by examiner

*Primary Examiner* — Lisa Lea Edmonds
*Assistant Examiner* — Xanthia C Cunningham
(74) *Attorney, Agent, or Firm* — Wei Te Chung; Ming Chieh Chang

(57) ABSTRACT

A heat dissipating system adapted to dissipate heat generated from an electrical package mounted onto a socket connector, comprises a clip defining a downward lower pressing portion; and a heat dissipating device disposed under the clip, being adapted to in contact with a surface of the electrical package and embedded with a number of springs evenly disposed on an upper surface thereof adapted to be pressed by the pressing portion.

20 Claims, 6 Drawing Sheets

US 8,437,138 B2

LOWER PROFILE HEAT DISSIPATING SYSTEM EMBEDDED WITH SPRINGS

BACKGROUND OF THE INVENTION

1. Field of the Invention

The present invention relates to a lower profile heat dissipating system embedded with springs, thereby lowering and benefiting an overall height of an electrical connection system for compact application when the heat dissipating system is assembled to the electrical connection system.

2. Description of the Prior Art

U.S. Pat. No. 7,589,972, issued to Ma on Sep. 15, 2009, discloses an socket connector assembly made in accordance with a preferable embodiment of the invention comprises an electrical socket with a plurality of contacts received therein, an IC module mounted onto the electrical socket so as to make electrical connection therebetween, a heat dissipating system comprising heat sink assembly pressing on the IC module and including a heat spreader and a clip fastening the heat sink assembly above the IC module. The IC module comprises a substrate and at least one die attached on a top surface of the substrate. The clip has a set of first fingers for pressing the die of the IC module and a set of second fingers for pressing the heat spreader. However, one disadvantage of Ma is the clip having second fingers downwardly for pressing the heat spreader, therefore whole height of the electrical connection is comparably bulky for the above-described application. Additional, in order to provide pressure force evenly distributed to the heat spreader and the electrical package, the clip is formed with a number of spring fingers, thus having a complicated structure.

Accordingly, a new heat dissipating system that solves the above problems is desirable.

SUMMARY OF THE INVENTION

Accordingly, an object of the present invention is to provide a lower profile heat dissipating system provided with thermal solution embedded with springs.

To fulfill the above object, a heat dissipating system adapted to dissipate heat generated from an electrical package mounted onto a socket connector, comprises a clip defining a downward lower pressing portion; and a heat dissipating device disposed under the clip, being adapted to in contact with a surface of the electrical package and embedded with a number of springs evenly disposed on an upper surface thereof adapted to be pressed by the pressing portion.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Referring to FIGS. 1-6, a socket connector assembly 3 in accordance with a preferred embodiment of the present invention is shown, which is adapted for electrically connecting an electrical package 1 and a printed circuit board 2.

Figure 1:
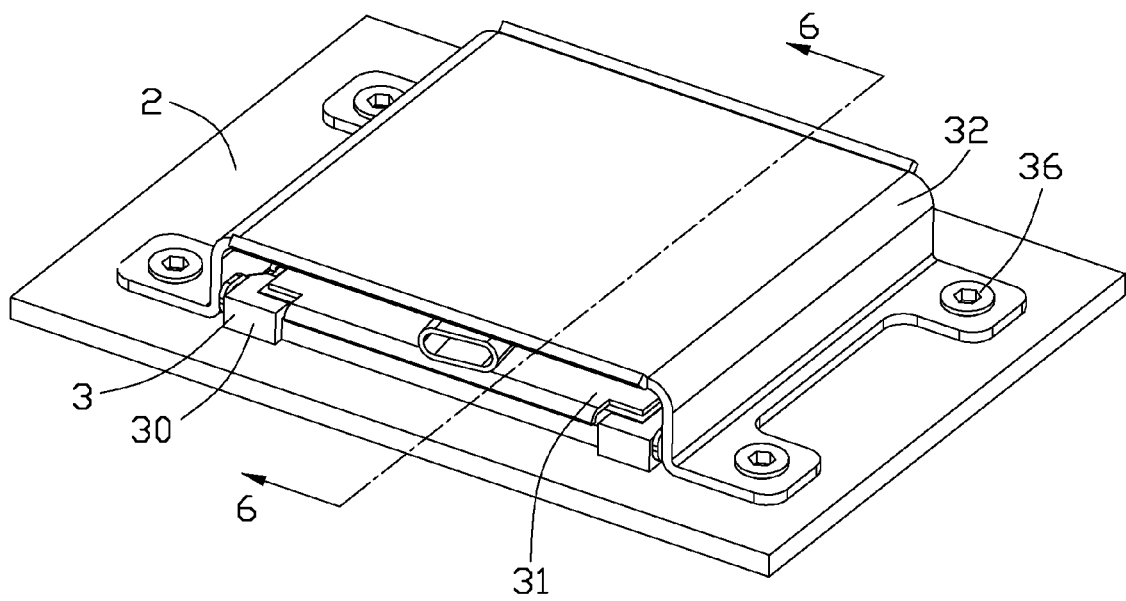
FIG. 1 is an assembled, perspective view of a socket connector assembly receiving an electrical package and mounted on a printed circuit board, in accordance with the present invention.
Figure 2:
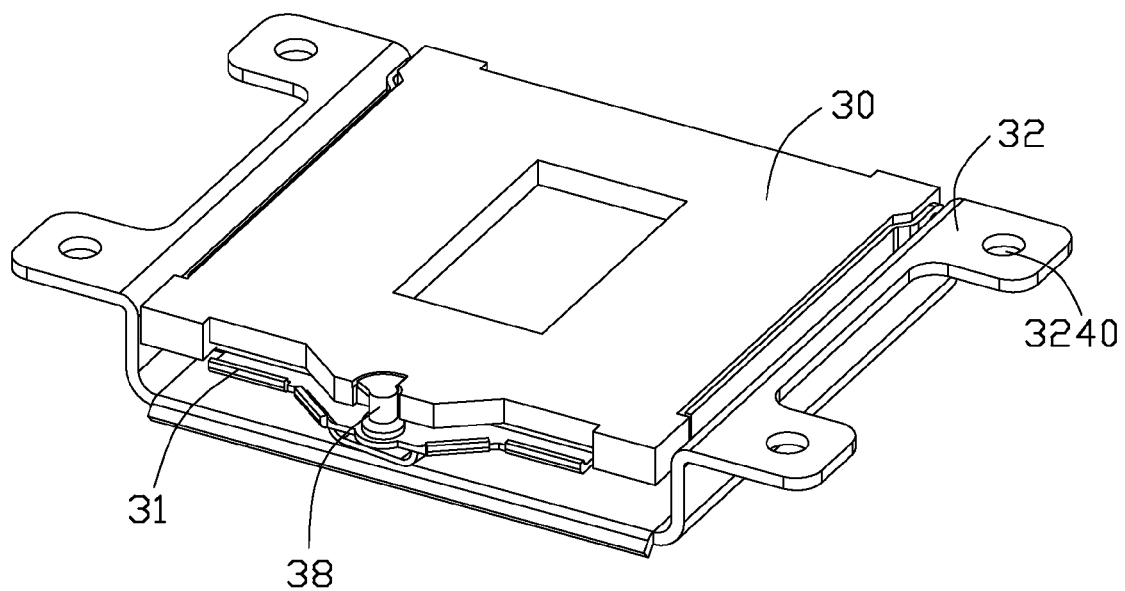
FIG. 2 is similar to FIG. 1, taken from a bottom side, wherein the printed circuit board is removed from the socket connector assembly.
Figure 3:
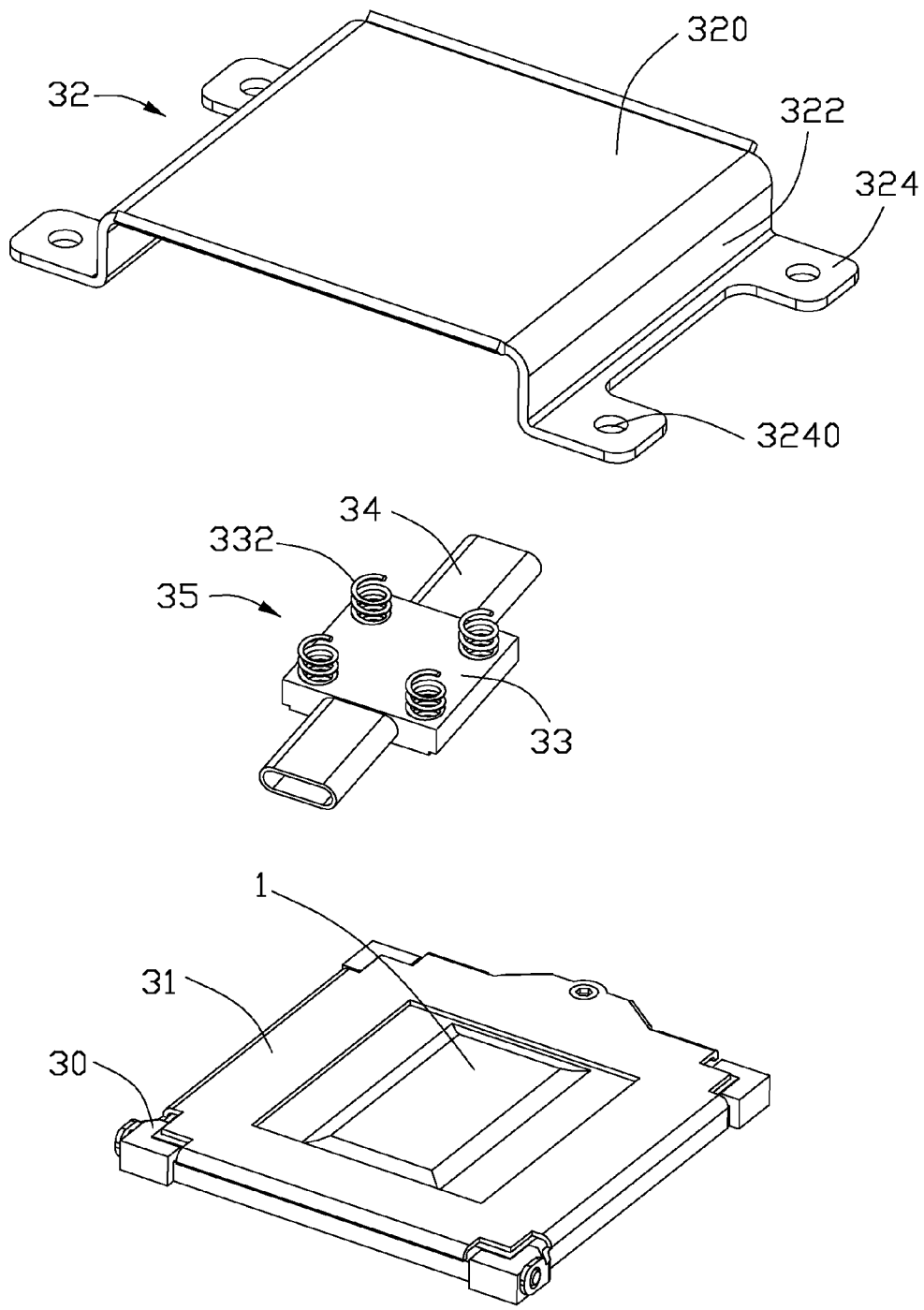
FIG. 3 is a partially assembled, perspective view of the socket connector assembly in FIG. 1, wherein a heat spreader and a cover plate are removed from the socket connector assembly.
Figure 4:
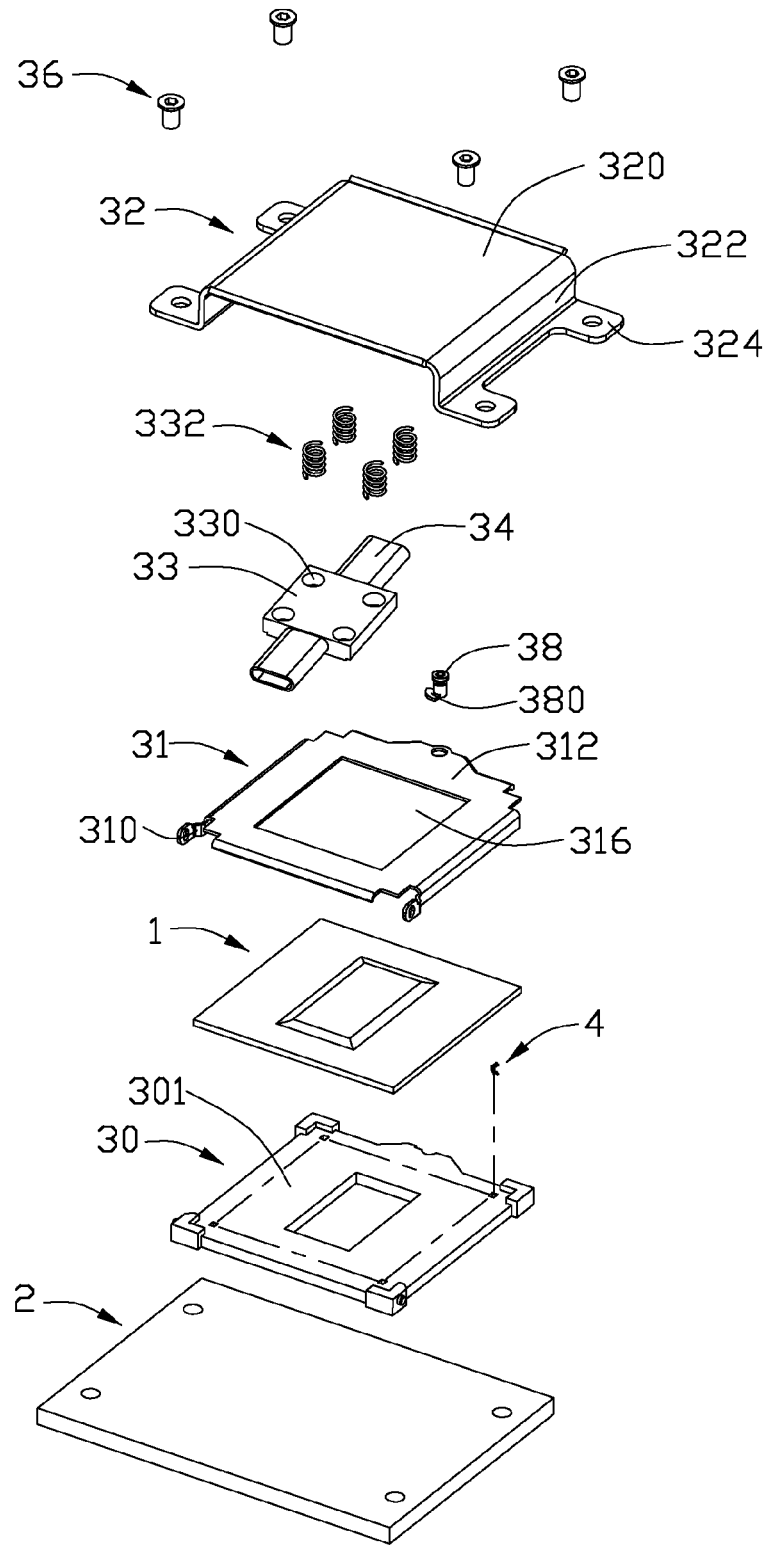
FIG. 4 is an exploded, perspective view of the socket connector assembly in FIG. 1.
Figure 5:
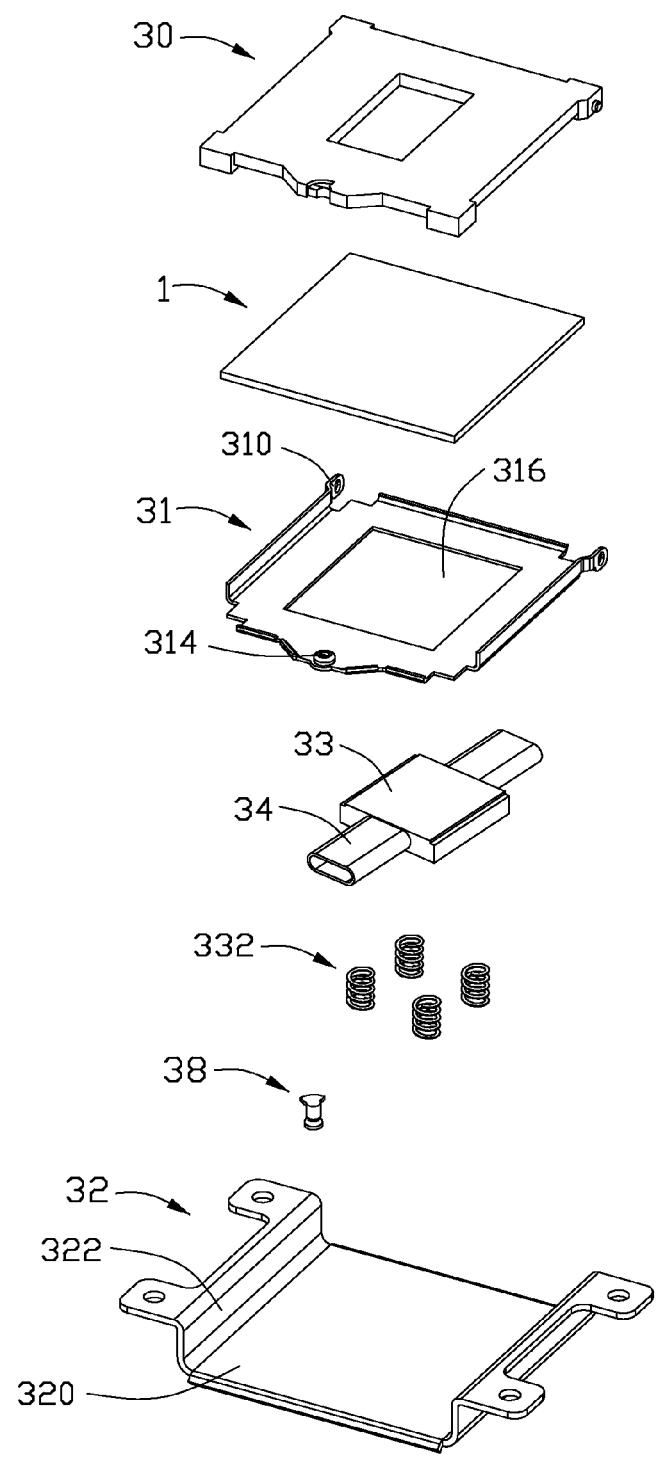
FIG. 5 is similar to FIG. 4, taken from a bottom side.

The socket connector assembly 3 comprises an insulative housing 30, a protective plate 31, a clip 32, a heat spreader 33 embedded with two heat pipes 34, and a plurality of fastening members 36. One end of the protective plate 31 has two connecting portion 310 at opposite edges, which are pivotally mounted on opposite sidewalls of the insulative housing 30 thereby allowing the protective plate 31 rotating between a closed position and an opening position relative to the housing 30. An opposite end of the protective plate 31 defines an extending portion 312 with an opening thereon. The protective plate 31 further defines a screw member 314 arranged on a lower surface of the extending portion 312 and communicated with the opening. Referring to FIG. 2, when the protective plate 31 is at the closed position, a latch member 38 is used to interconnect with the screw member 314. The latch member 38 is formed with thread on one end thereof and a blade 380 on the other end for grasping a portion of the housing 30, thereby preventing rotation of the protective plate 31 when it is at the closed position. The heat spreader 33 with the heat pipes 34 are seated on the electrical package 1 received in the insulative housing 30. The clip 32 is covered on the heat spreader 33.

The insulative housing 30 defines a space 301 for receiving the electrical package 1 and receiving a plurality of terminals (not labeled). The protective plate 31 is stamped from a metal piece and mounted on the housing 30. The protective plate 31 has an opening 316 corresponding to the space 301 of the housing, so as to allow the heat pipe 34 to be contacted with the electrical package 1.

The clip 32 is located upon the heat spreader 33 and covers the insulating housing 30. The clip 32 is piece-like and comprises an elongate plate 320 and a pair of wings 322 extending downwardly from opposite edges of the elongate plate 320, the wings 322 each defining a pair of mounting pads 324 bending from opposite ends thereof and extending along a horizontal direction. The mounting pads 324 each have a through hole 3240 thereon allowing the fastening members 34 passing through. The elongate plate 320 is formed with a flat bottom surface for pressing screws 332 of the heat spreader 33.

The heat spreader 33 has two heat pipes 34 assembled therein. The upper surface of the heat spreader 33 defines four holes 330 symmetrically disposed at four corners of the heat spreader 33. The four holes 330 each have a spring 332 (i.e., a biasing device) received therein. In a non-working status, the springs 332 extend beyond the upper surface of the heat spreader 33. The heat spreader 33, the two heat pipes 34, and the springs 332 commonly define a heat dissipating device 35.

In an assembly process, the electrical package 1 is received in the space 301 of the housing 30 and the heat spreader 33 is located upon the electrical package 1 and contacting with the electrical package 1. The clip 32 covers the heat spreader 33 with the flat bottom surface thereof downwardly pressing on upper end of the springs 332. The springs 332 are symmetrically disposed at four corners of the heat spreader 33, thus the clip 32 can asset downward force evenly to the heat spreader 33. Accordingly, electrical connection with thermal solution will be established between the printed circuit board 2 and the electrical package 1 by the socket connector assembly 3.

Figure 6:
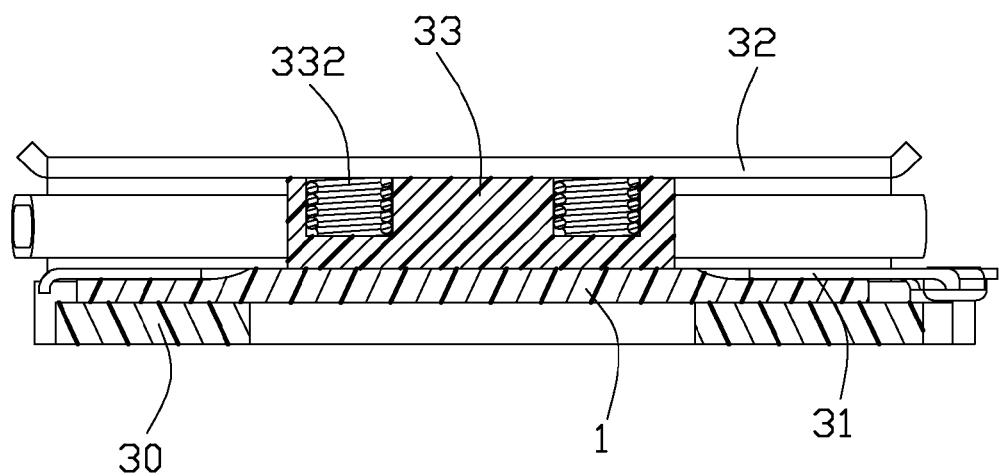
FIG. 6 is a cross-sectional view taken along line 6-6 in FIG. 1.

Referring to FIG. 6, after the clip 32 is fastened to the printed circuit board 2 by the fastening members 36, the springs 332 is compressed downwardly. Since upper end of the springs 332 is nearly flush to the upper surface of the heat spreader 33 after deformed under pressure from the clip 32, height of whole thermal solution is comparably lower and suitable for thin application. Moreover, the elongate plate 320 of the clip 32 is of a plate-like structure for pressing the heat spreader 33, thus the clip has a simple structure with a lower manufacturing cost.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A heat dissipating system adapted to dissipate heat generated from an electrical package mounted onto a socket connector, comprising:
   a clip defining a downward lower pressing portion; and
   a heat dissipating device disposed under the clip, being adapted to in contact with a surface of the electrical package and embedded with a number of springs evenly disposed on an upper surface thereof adapted to be pressed by the pressing portion.

2. The heat dissipating system of claim 1, wherein the heat dissipating device comprises a heat spreader embedded with at least one heat pipe.

3. The heat dissipating system of claim 2, wherein the springs is disposed on an upper surface of the heat spreader.

4. The heat dissipating system of claim 3, wherein the upper surface of the heat spreader defines four holes symmetrically disposed at four corners of the heat spreader.

5. The heat dissipating system of claim 1, wherein the lower pressing portion of the clip is a flat plane.

6. The heat dissipating system of claim 1, wherein the clip has a cover plate comprising an elongate plate for pressing the springs of the heat spreader and a pair of wings extending downwardly from opposite edges of the elongate plate, the wings each defining a pair of mounting pads bending from opposite ends thereof and extending along a horizontal direction.

7. The heat dissipating system of claim 6, wherein the mounting pads each define a through hole extending therethrough.

8. The heat dissipating system of claim 6, wherein the elongate plate is formed with a flat bottom surface for pressing the springs of the heat dissipating device.

9. A socket connector assembly, comprising:
   a socket body defines a number of contacts received therein;
   an electrical package mounted onto the socket body so as to establish electrical connection therebetween;
   a heat dissipating device pressing on the electrical package and including a heat spreader equipped with a number of embedded springs evenly disposed on an upper surface of the heat spreader; and
   a clip pressing on the springs of the heat dissipating so as to assert downward force evenly to the heat spreader and the electrical package.

10. The heat dissipating system of claim 9, wherein the heat dissipating device comprises a heat spreader embedded with at least one heat pipe.

11. The heat dissipating system of claim 10, wherein the springs is disposed on an upper surface of the heat spreader.

12. The heat dissipating system of claim 11, wherein the upper surface of the heat spreader defines four holes symmetrically disposed at four corners of the heat spreader.

13. The heat dissipating system of claim 10, wherein the clip defines a flat plane for pressing the springs of the heat spreader.

14. A socket connector assembly comprising:
   a socket body having a plurality of contacts therein;
   an electronic package mounted upon the socket body and electrically connected to the contacts;
   a monolithic heat spreader intimately downwardly pressing the electronic package with at least a heat pipe extending therethrough;
   a clip defining a top plate closely positioned above the heat spreader with a tiny gap therebetween in a vertical direction; and
   a biasing device having an upper end section contacting the plate and a lower end section contacting the heat spreader; wherein
   the heat spreader defines a recess in a top face thereof to receive the lower end section of the biasing device so as to keep the biasing device with a sufficient dimension for generate corresponding resilient forces without significantly increasing the total height of the total height of a combination of said socket body, said electronic package, said heat spreader and said clip.

15. The socket connector assembly as claimed in claim 14, wherein the biasing device is a discrete part with regard to both the clip and the heat spreader while having the upper end section and the lower end section thereof forcibly butt against the clip and the heat spreader, respectively.

16. The socket connector assembly as claimed in claim 14, wherein said clip further includes a plurality of mounting pads surrounding the socket body and adapted to be mounted to a printed circuit board.

17. The socket connector assembly as claimed in claim 14, wherein the top plate of the clip is essentially complete to fully shield the heat spreader thereunder.

18. The socket connector assembly as claimed in claim 14, wherein said recess is essentially a blind hole, and the biasing device is essentially a coil spring, of which the lower end section is received in said blind hole.

19. The socket connector assembly as claimed in claim 18, wherein the whole coil spring is almost embedded within the blind hole.

20. The socket connector assembly as claimed in claim 19, wherein there are four coil springs and four blind holes receiving the four coil springs, respectively, around four corners of the heat spreader and the heat pipe is essentially located between the corresponding coil springs transversely.

* * * * *